United States Patent [19]

Miller

[11] Patent Number: 4,470,192

[45] Date of Patent: Sep. 11, 1984

[54] METHOD OF SELECTED AREA DOPING OF COMPOUND SEMICONDUCTORS

[75] Inventor: David L. Miller, Thousand Oaks, Calif.

[73] Assignee: Rockwell International Corporation, El Segundo, Calif.

[21] Appl. No.: 524,967

[22] Filed: Aug. 22, 1983

[51] Int. Cl.³ .................... H01L 21/203; C23C 13/08
[52] U.S. Cl. ................................ 29/576 B; 148/175; 148/1.5; 156/612; 357/91
[58] Field of Search ............... 29/576 B; 148/175, 1.5; 156/612; 357/91

[56] References Cited

U.S. PATENT DOCUMENTS

| | | |
|---|---|---|
| 4,071,383 | 1/1978 | Nagata et al. ...................... 148/175 |
| 4,086,108 | 4/1978 | Gonda ................................ 148/175 |
| 4,242,149 | 12/1980 | King et al. ........................ 148/1.5 |
| 4,261,771 | 4/1981 | Dingle et al. ..................... 148/175 |
| 4,312,681 | 1/1982 | Rupprecht et al. ............... 148/175 |
| 4,383,872 | 5/1983 | Roberts ............................. 148/175 |
| 4,392,453 | 7/1983 | Luscher ............................ 148/175 |

OTHER PUBLICATIONS

Neave et al., Jour. Crystal Growth, 44 (1978) 387.

*Primary Examiner*—Upendra Roy
*Attorney, Agent, or Firm*—H. Fredrick Hammann; Craig O. Malin

[57] ABSTRACT

A method is provided for selectively doping a compound semiconductor such as GaAs in situ by molecular beam epitaxy. The surface of the GaAs is coated with a thin layer of As by exposing it to an arsenic flux within a molecular beam epitaxy chamber. Selected areas of the surface are irradiated with a laser beam or a beam of photons, electrons, or ions in order to desorb As and form a mask of As on the surface. Dopant material such as tin is then deposited over the surface and As mask. The semiconductor is then heated to desorb the As mask while leaving the dopant in the unmasked areas. An epitaxial layer of GaAs is then grown over the surface by molecular beam epitaxy.

12 Claims, 6 Drawing Figures

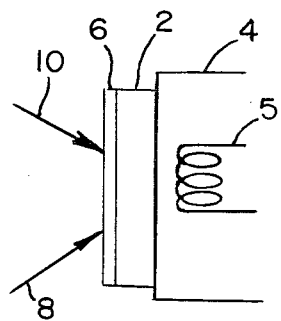
FIG. IA
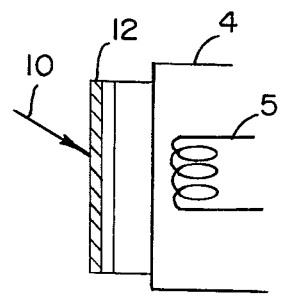
FIG. IB
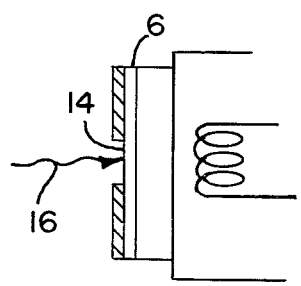
FIG. IC
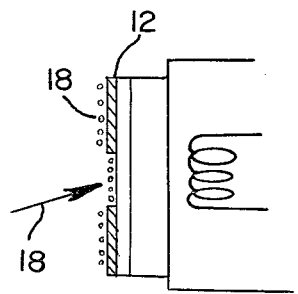
FIG. ID
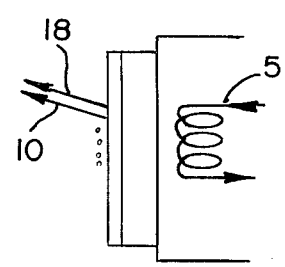
FIG. IE
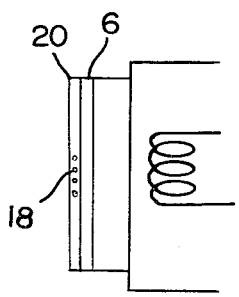
FIG. IF

METHOD OF SELECTED AREA DOPING OF COMPOUND SEMICONDUCTORS

BACKGROUND OF THE INVENTION

This invention relates to the field of integrated circuit fabrication and particularly to the doping of compound semiconductors.

Conventional integrated circuit technologies have been successful in producing a wide variety of circuits and devices. Recently, integrated circuits and devices also have been developed using GaAs and other III-V compound semiconductors because of their speed advantage over comparable Si devices, because of the wide range of bandgaps available for optical signal processing, and because of the possibilities for high temperature operation. In the compound semiconductors, however, the limits of existing fabrication technologies are being reached, and new techniques are needed to fully exploit their potential. In particular, exploitation of techniques to fabricate truly three-dimensional device and circuit structures has the potential to dramatically lessen the constraints of conventional processing and device design. Further advantages in device yield and process control can be expected by integrating device processing with epilayer growth, using the controlled environment of the growth apparatus. This would lead to an in situ 3-D device capability with enhanced design freedom and device yield.

Presentlly, compound seimconductors are selectively doped using ion implantation. The surface to be doped is either a polished GaAs wafer cut from GaAs boule, or is first formed epitaxially by a process such as molecular beam epitaxy (MBE). In the latter case the semiconductor material is then removed from the high vacuum MBE-chamber and a mask of photoresist or other ion-blocking materials such as $Si_3N_4$ formed on its surface. The masked semiconductor is placed in an ion implantation chamber and bombarded with dopant ions. Those areas of the semiconductor's surface which are not covered by the mask receive the dopant.

If uniform (non-selective) doping of the entire surface is desired, the surface can be doped in situ in the same chamber used to grow the surface. If the dopant impinges on the growing layer, the doping density will be proportional to the dopant flux divided by the growth rate of the epitaxial material. Dopant variations in the direction of growth (perpendicular to the epitaxial surface) may be caused by varying the dopant flux with time. In extreme cases, the dopant atoms may be deposited in a single plane. For example MBE growth of GaAs can be suspended, and dopants such as Si, Ge, Be, and Sn introduced into the MBE chamber. A submonolayer of the dopant is deposited in situ, and when MBE growth of the GaAs is resumed the dopant is incorporated into the growing layer. The doping is accomplished without removing the semiconuctor from the high vacuum chamber. However, the entire surface is doped in a non-selective manner.

SUMMARY OF THE INVENTION

It is an object of the invention to provide a method for doping selective areas of a compound semiconductor in situ within a molecular beam epitaxy (MBE) chamber.

According to the invention, the MBE growth of a compound semiconductor such as GaAs is interrupted to allow the substrate to cool while exposing the surface to a flux of arsenic (As). This causes a thin layer of As to condense on the GaAs epilayer. The As is then patterned using a beam such as a laser beam or electron beam to desorb the As in selected areas. The in situ patterning of the As layer forms a mask which covers and exposes selected regions of the GaAs surface.

In the next step, submonolayer amounts of dopant are deposited uniformly across the masked surface. Then the surface is warmed, and the As mask with its dopant is desorbed, thus preferentially removing some or all of the dopant from selected areas of the surface where the As had masked it.

After desorbing the mask, GaAs epilayer growth is resumed and the dopant is incorporated into selected areas of the epilayer. The use of an As mask and the in situ processing within the ultra high vacuum of the MBE growth chamber leads to a planar surface with improved interface properties compared to prior art processes which require that the wafer be removed from MBE growth chamber in order to obtain selective doping of the surface.

These and other objects and features of the invention will be apparent from the following detailed description taken with reference to the accompanying drawing.

BRIEF DESCRIPTION OF THE DRAWING

The drawing is an illustration of six steps FIGS. 1A-1F, in the selective doping of a GaAs epilayer.

DESCRIPTION OF THE PREFERRED EMBODIMENT

The attached drawing illustrates the invention as applied using molecular beam epitaxy (MBE). MBE is a well-known and useful technique for the fabrication of epilayers and abrupt heterojunctions of compound semiconductors. It is an attractive epitaxial growth technique for the preparation of single crystal semiconductor surfaces because of the ultrahigh vacuum ambients (less than $10^{-10}$ torr).

FIG. 1A in the drawing shows a GaAs substrate 2 mounted to a standard MBE substrate holder 4 with heater 5. A GaAs epilayer 6 is being grown on substrate 2 using a Ga flux 8 and an $As_4$ or $As_2$ flux 10 generated in the conventional manner in an MBE apparatus.

After growth of the desired epilayer 6, a mask layer 12 of elemental As is deposited shown in FIG. 1B. The As comes from the arsenic flux 10 used during the growth of epilayer 6 and consists of $As_4$ or $As_2$ derived from the sublimation of elemental arsenic. The gallium flux 8 is abruptly shuttered to terminate the growth of layer 6, while arsenic flux 10 remains impinging on the surface of epilayer 6. At typical MBE growth temperatures, (550 degrees to 650 degrees C), no condensation of As ocurs (arsenic has a very low sticking coefficient to itself at these temperatures) but the $As_4$ or $As_2$ flux prevents surface decomposiion. After terminating epilayer growth, the substrate heater 5 is turned off and the substrate holder 4 is allowed to cool by radiation and/or conduction of heat to the MBE system's liquid nitrogen cooled internal shroud. Epilayer 6 remains within the central portion of the As flux. The epilayer is cooled to below room temperature in order to condense a sufficiently thick arsenic mask layer 12.

In FIG. 1C of the drawing, a pattern is developed in mask 10 by desorbing the arsenic from selected areas 14 of epilayer 6 using a pulsed $CO_2$ laser beam 16. The As may be easily removed by thermal desorption in the ultra high vacuum of the MBE chamber. After desorbing, area 14 is a clean, ordered, stoichiometric GaAs surface.

A fraction of a monolayer of dopant 18 is deposited over the entire surface of mask 12 and selected areas 14 as illustrated in FIG. 1D. The dopant used in a preferred embodiment is tin (Sn), and it is deposited while the substrate is at a temperature slightly below room temperature. Tin is a particularly attractive dopant for this process because it is incorporated from a surface concentration which "rides along" with the growth surface. Therefore, deposition of tin atoms on a GaAs surface and subsequent overgrowth with GaAs results in the dopant being distributed through several thousand angstroms of material.

The entire wafer is then heated to about 350 degrees C (FIG. 1) to thermally desorb the remaining AS, as well as the dopant deposited over it. The dopant deposited on the As-free areas 14 remains behind because the temperature required to desorb As is far too low to desorb most dopants (including Sn) from a clean GaAs surface.

In the final FIG. 1F, an epilayer of GaAs 20 is grown over the surface of the wafer with its selective deposit of dopant. When Sn is used as the dopant, the well-known surface segregation pehnomenon provides n-type Sn doping for several thousand angstroms past the surface upon when the Sn was deposited.

All steps of the process are accomplished without removing the wafer from the ultra high vacuum of the MBE system. Thus, the initial epilayer 6, the dopant 18, and the final epilayer 20 which incorporates the dopant are all deposited under conditions which avoid any contamination or reaction of the wafer.

The invention has been described above for an embodiment utilizing tin for doping GaAs in a MBE system. However the invention can be used with other dopants, compound semiconductors, and ultra high vacuum systems. For example, other dopants such as Si, Ge, and Be may be used provided that they have a sufficiently large sticking coefficient to remain on the semiconductor surface during desorbtion of the mask, and low enough surface mobility to stay put in the selected area.

The method is applicable to other compund semiconductors such as group III-V and group II-VI binary, ternary, and quaternary compounds. It appears particularly useful for binary and ternary compounds of $Al_xGa_{1-x}As$ where x may be in the range of 0 to 1, and may be different for different layers in the wafer. The masking overlayer comprises the most volatile (higher vapor-pressure), nonmetallic constituent element of the semiconductor such as the As, Sb, S, Se, and Te in arsenide, antimonide, sulfide, selenide, and telluride compound semiconductor. Other volatile elements can be used to form the masking overlayer provided that they are from the same group (III-V or II-VI) in the periodic table as the compound semiconductor being treated, and provided that they do not react with or otherwise contaminate the compound semiconductor.

Desorption of selected areas of the masking overlayer can be accomplished by any beam which is capable of heating or sputtering selective areas of the wafer surface without contaminating the high vacuum system or damaging the substrate material. Such beams may include laser beams, non-laser photon beams, electron beams, and ion beams.

In addition to the exemplary MBE system, other systems which are used to form epilayers can be used to practice the invention, provided that the system provides a high vacuum atmosphere. Such systems include vapor phase epitaxy (VPE), and metallorganic chemical vapor deposition (MO-CVD).

Thus, numerous variations and modifications can be made without departing from the invention. Accordingly, it should be understood that the form of the invention described above is illustrative and is not intended to limit the scope of the invention.

What is claimed is:

1. A method of selective area doping compound semiconductors, comprising the steps of:
   exposing to a high vacuum the surface of a compound semiconductor selected from the group consisting of compounds from groups III-V and groups II-VI of the periodic table;
   selectively coating said surface with a thin layer of a volatile, non-reactive element selected from the same periodic table group as said compound semiconductor;
   depositing dopant material over said surface and over said thin layer;
   heating said surface, whereby said thin layer with said dopant is desorbed from said surface leaving said dopant on the portions of said surface which were not selectively coated with said thin layer; and
   growing an epitaxial layer of semiconductive material on said surface.

2. The method as claimed in claim 1 wherein said step of exposing comprises exposing said surface to a high vacuum in a molecular beam epitaxy chamber.

3. The method as claimed in claim 1 wherein said step of selectively coating comprises:
   depositing said element on said surface; and
   selectively desorbing said element from said surface.

4. The method as claimed in claim 3 wherein said step of selectively desorbing comprises irradiating selected areas of said surface with a laser beam.

5. The method as claimed in claim 3 wherein said step of selectively desorbing comprises irradiating selected areas of said surface with an intense photon beam.

6. The method as claimed in claim 3 wherein said step of selectively desorbing comprises irradiating selected areas of said surface with an electron beam.

7. The method as claimed in claim 3 wherein said step of selectively desorbing comprises irradiating selected areas of said surface with an ion beam.

8. The method as claimed in claim 1 wherein said compound semiconductor comprises an $Al_xGa_{1-x}As$ compound, and wherein said element comprises As.

9. The method as claimed in claim 1 wherein said dopant material comprises tin.

10. The method as claimed in claim 1 wherein said element comprises the most volatile constituent element forming said compound semiconductor.

11. The method as claimed in claim 1 wherein said dopant material is selected from the group consisting of Sn, Si, Ge, and Be.

12. A method of selective area doping an $Al_xGa_{1-x}As$ semiconductor, comprising the steps of:
   exposing the surface of an $Al_xGa_{1-x}As$ semiconductor to a vacuum inside a molecular beam epitaxy chamber;
   exposing said surface to a flux of As to deposit a thin layer of As on said surface;

irradiating a selected area of said surface with a laser beam so that As is desorbed from said selected area;

depositing dopant material over said selected area and over said thin layer of As;

heating said surface to a temperature of approximately 350 degrees C, whereby said thin layer of As with said dopant material is desorbed from said surface leaving said dopant on said selected area; and growing a layer of $Al_xGa_{1-x}As$ on said surface by molecular beam epitaxy.

* * * * *